US009472924B2

(12) United States Patent
Majcher et al.

(10) Patent No.: US 9,472,924 B2
(45) Date of Patent: Oct. 18, 2016

(54) INTEGRATED POWER DELIVERY SYSTEM FOR PRINTED CIRCUIT BOARDS

(71) Applicant: BAE Systems Information and Electronic Systems Integration Inc., Nashua, NH (US)

(72) Inventors: Jared P. Majcher, Manchester, NH (US); Timothy M. Dresser, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/429,140

(22) PCT Filed: Jul. 16, 2014

(86) PCT No.: PCT/US2014/046777

§ 371 (c)(1),
(2) Date: Mar. 18, 2015

(87) PCT Pub. No.: WO2015/009775

PCT Pub. Date: Jan. 22, 2015

(65) Prior Publication Data

US 2015/0214642 A1 Jul. 30, 2015

Related U.S. Application Data

(60) Provisional application No. 61/847,682, filed on Jul. 18, 2013.

(51) Int. Cl.

| | |
|---|---|
| ***H01R 12/00*** | (2006.01) |
| ***H02B 1/56*** | (2006.01) |
| ***H05K 7/20*** | (2006.01) |
| ***H01R 4/48*** | (2006.01) |
| ***H01R 12/52*** | (2011.01) |
| ***H02B 1/20*** | (2006.01) |
| ***H01Q 21/00*** | (2006.01) |

(52) U.S. Cl.

CPC ............ *H02B 1/56* (2013.01); *H01Q 21/0087* (2013.01); *H01R 4/48* (2013.01); *H01R 12/52* (2013.01); *H02B 1/20* (2013.01); *H05K 7/209* (2013.01); *H05K 7/20927* (2013.01)

(58) Field of Classification Search

CPC .......... H01R 4/28; H01R 4/48; H01R 12/52; H02B 1/56; H02B 1/20; H05K 7/209; H05K 7/20927

USPC .................................. 439/65, 74, 75, 81, 82

See application file for complete search history.

(56) References Cited

U.S. PATENT DOCUMENTS

| | | | |
|---|---|---|---|
| 5,380,211 | A | 1/1995 | Kawaguchi et al. |
| 6,824,399 | B2 | 11/2004 | Smith et al. |
| 2001/0036066 | A1 | 11/2001 | Dibene, II et al. |
| 2002/0127909 | A1 | 9/2002 | Pradier et al. |
| 2002/0164894 | A1 | 11/2002 | Hartke et al. |
| 2006/0181857 | A1 | 8/2006 | Belady et al. |
| 2008/0318447 | A1 | 12/2008 | Tomioka et al. |

OTHER PUBLICATIONS

PCT/US14/46777, ISR mailed on Nov. 4, 2014.

*Primary Examiner* — Khiem Nguyen

(74) *Attorney, Agent, or Firm* — Daniel J. Long; Antony P. Ng; Scott J. Asmus

(57) ABSTRACT

An integrated DC power delivery system for PCBs is disclosed. In one embodiment, the system includes a compliant mechanical coupling assembly. The system further includes a power distribution interface having power planes configured to receive the DC power via the complaint mechanical coupling assembly upon securing the compliant mechanical coupling to the power distribution interface to provide the needed mechanical support.

9 Claims, 4 Drawing Sheets

INTEGRATED POWER DELIVERY SYSTEM FOR PRINTED CIRCUIT BOARDS

CROSS-REFERENCE TO RELATED APPLICATIONS

This Application claims rights under 35 USC §119(e) from U.S. Application 61/847,682 filed Jul. 18, 2013, the contents of which are incorporated herein by reference.

BACKGROUND OF THE INVENTION

1. Field of the Invention

The present invention relates to printed circuit boards and more particularly to delivering power to the printed circuit boards.

2. Brief Description of Related Art

Typically, a top surface of a printed circuit board (PCB) assembly covered with integrated circuits are mounted on another assembly that delivers DC power and extract heat away from the PCB. Generally, such PCB assembly requires a large amount of DC power and also dissipates a large amount of power and further requires mechanically attaching in a removable way.

Typically, delivering DC power to PCBs is accomplished via large connectors. However, these connectors may not be able to be used as secure mechanical attachment mechanism. Instead, another approach bonds a large conductive area of the PCB with a conductive epoxy to the power source. Such bonding to provide the power and mechanical attachment may not be easily detachable, since the top surface of the PCB cannot be penetrated as they are, generally, covered with integrated circuits, and there would be no way to mechanically couple the assembly down to the top surface of the PCB.

SUMMARY OF THE INVENTION

An integrated DC power delivery system for PCB is disclosed. According to one aspect of the present subject matter, the system includes a compliant mechanical coupling assembly. The system further includes a power distribution interface having power planes configured to receive the DC power via the compliant mechanical coupling assembly upon securing the compliant mechanical coupling to the power distribution interface to provide the needed mechanical support. The system may further include a PCB including at least one integrated circuit that is disposed on top of the power distribution interface and electrically coupled to the power distribution interface to receive the DC power via the power planes in the power distribution interface.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design. The present technique provides an integrated DC power delivery system for PCBs via a compliant mechanical coupling mechanism and electrical connection that provides both the needed mechanical support and the needed DC power to the PCBs is the power planes of the power distribution board with substantially reduced structural stress. The present technique allows for the conservation of space on a PCB by allowing the mechanical coupling mechanism, such as the transfer lugs and the helical spring connectors to perform two functions, one being DC power delivery to the power planes of the power distribution interface and the other being mechanical fastening function.

The terms "mechanical coupling mechanism" and "mechanical coupling assembly" are being used interchangeably throughout the document. Further the terms, "power planes" and "power distribution planes" are used interchangeably throughout the document. Furthermore, the terms "power", "current", "DC power" and "DC current" are being used interchangeably throughout the document. Moreover, the term "power" refers to, high or low AC or DC power.

Figure 1:
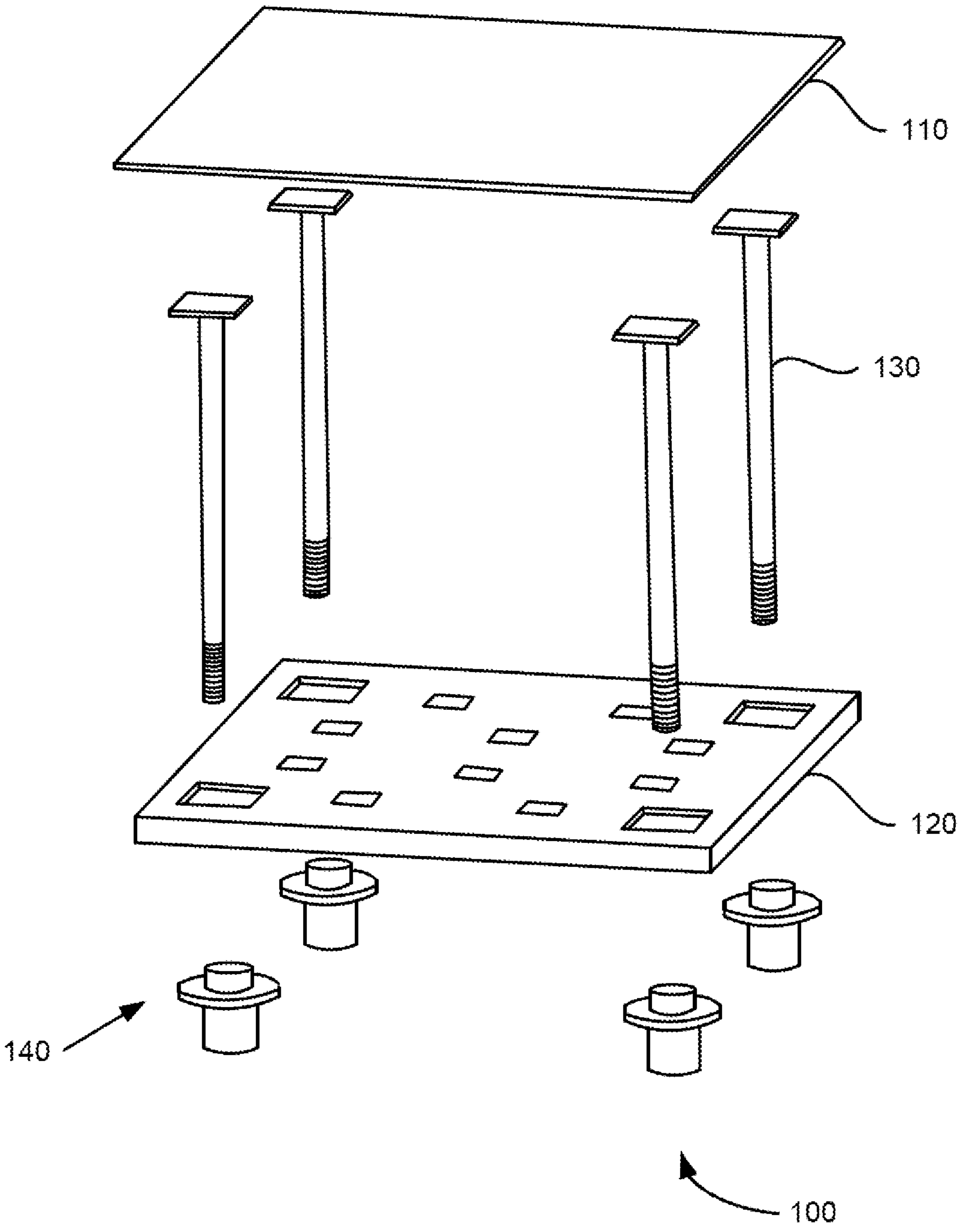
FIG. 1 is an exploded view of major components of an integrated DC power delivery system to PCBs, according to an example embodiment of the present subject matter.

FIG. 1 is an exploded view of major components of an integrated DC power delivery system 100 to PCBs, according to an example embodiment of the present subject matter. FIG. 1 shows a power distribution interface 210 (shown in FIG. 2) including a top surface/interposer 110 and a power distribution board 120 of the power distribution interface 210. Further, FIG. 1 shows a compliant mechanical coupling provided by a plurality of transfer lugs 130 and an associated plurality of helical spring connectors 140 used for transferring DC power to the power planes disposed on the power distribution board 120 of the power distribution interface 210. In these embodiments, the plurality of transfer lugs 130 are configured to carry DC current and, as shown in FIG. 1, the plurality of transfer lugs 130 are disposed through the power distribution board 120 and then into the plurality of associated helical spring connectors 140.

Figure 2:
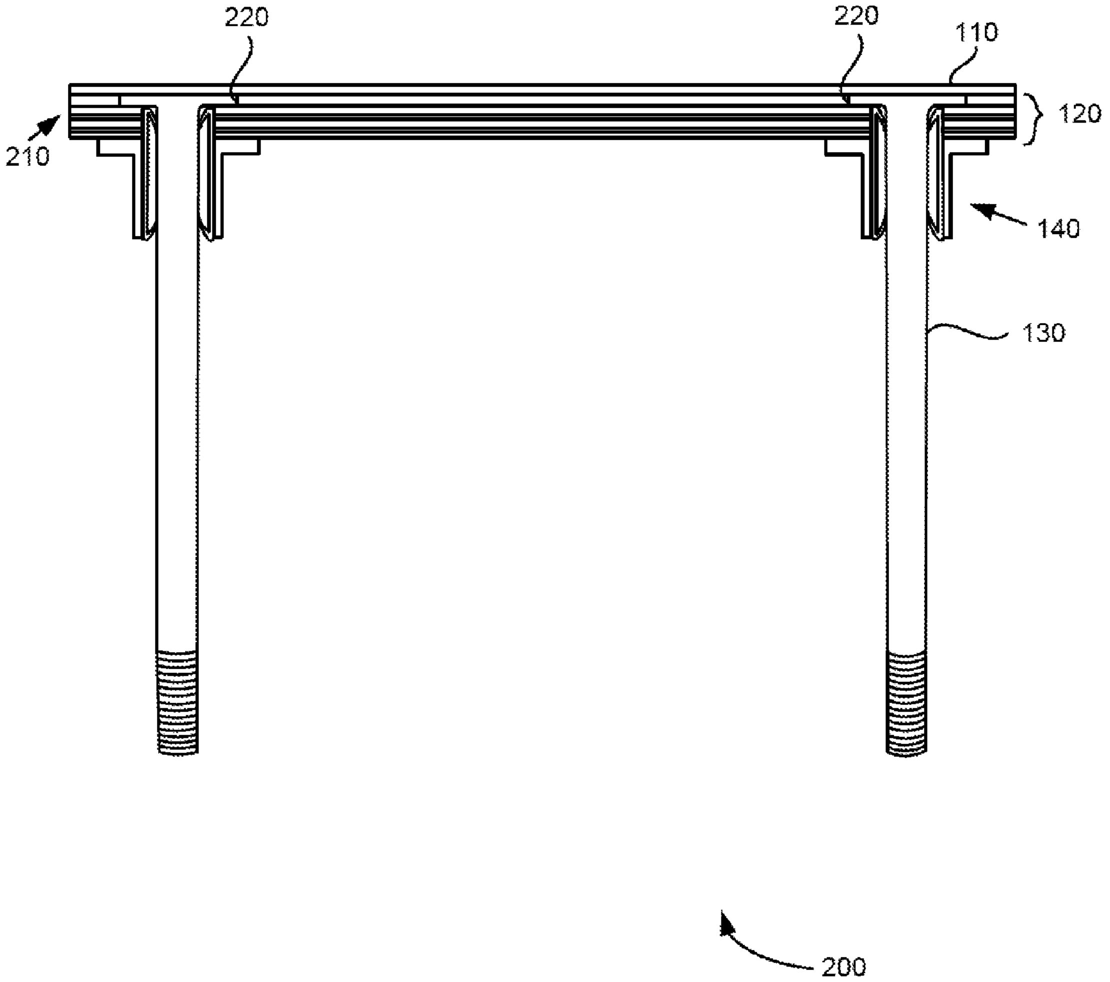
FIG. 2 is a cross-sectional view of the integrated DC power delivery system showing interconnectivity of the transfer lugs to the power distribution interface for providing the DC power to the power planes in the power distribution interface, such as those shown in FIG. 1, according to an example embodiment of the present subject matter.

FIG. 2 is a cross-sectional view 200 of the integrated DC power delivery system showing interconnectivity of the plurality of transfer lugs 130 via the associated plurality of helical spring connectors 140 to the power distribution board 120 of the power distribution interface 210, such as those shown in FIG. 1, according to an example embodiment of the present subject matter. Further, FIG. 2 shows an established mechanical and electrical interconnectivity between the plurality of transfer lugs 130, plurality of associated helical spring connectors 140 and the power planes 330 (shown in FIG. 3) of the power distribution interface 210 for delivering the needed DC power to the power planes 330 (shown in FIG. 3) upon securing the plurality of transfer lugs 130 to the power distribution interface 210 via the associated plurality of helical spring connectors 140.

Figure 3:
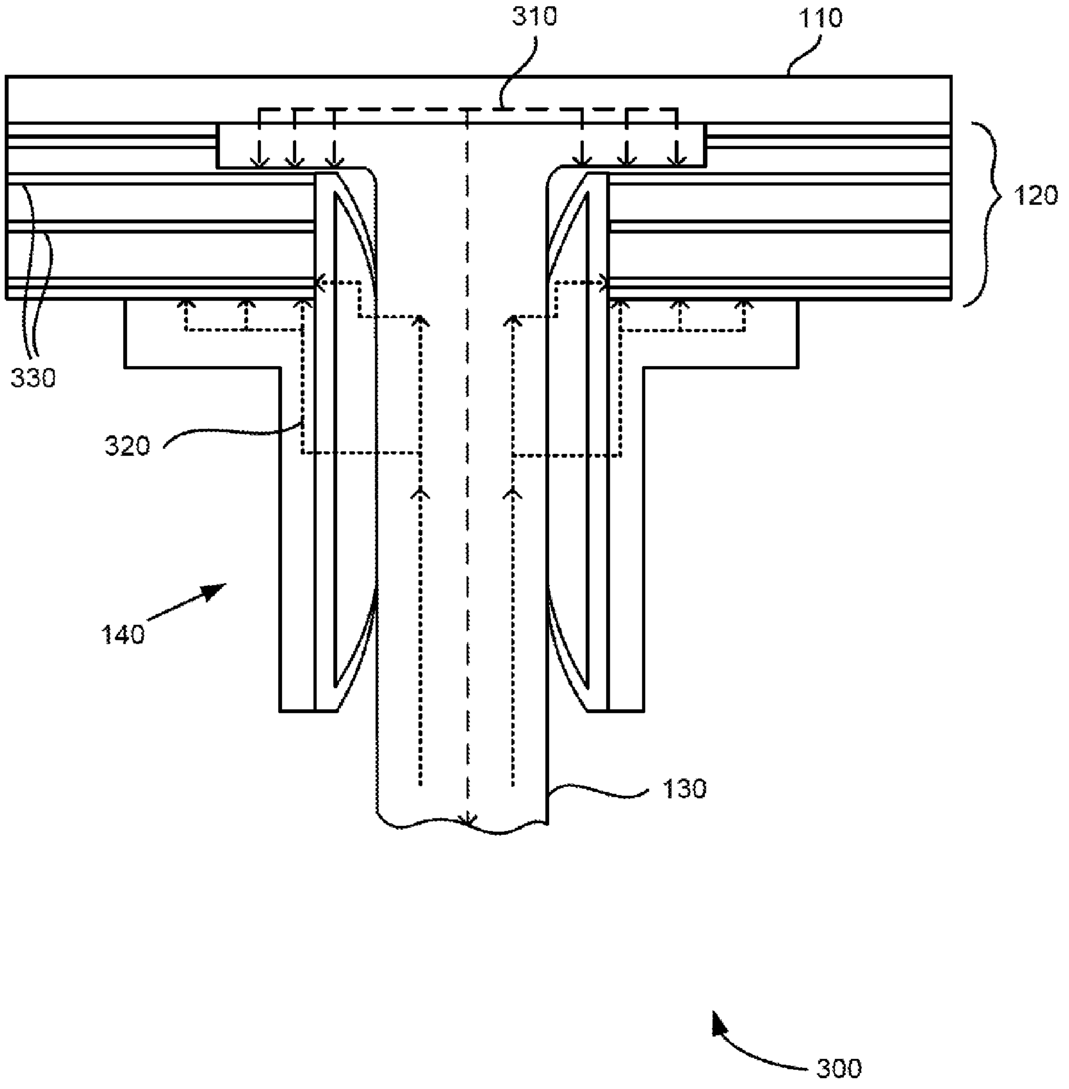
FIG. 3 is a cross-sectional view of the integrated DC power delivery system to the PCB, such as those shown in FIGS. 1-2, showing the mechanical force distribution along with power flow paths, according to an example embodiment of the present subject matter.

FIG. 3 is a schematic diagram of a cutaway view 300 showing mechanical and electrical interconnectivity established between the plurality of transfer lugs 130, plurality of associated helical spring connectors 140 and the power planes 330 (shown in FIG. 3) of the power distribution interface 210 for delivering the needed DC power to the power planes 330 (shown in FIG. 3) upon securing the plurality of transfer lugs 130 to the power distribution interface 210 via the associated plurality of helical spring connectors 140. Further FIG. 3 shows mechanical force distribution 310 along with power flow paths 320 upon securing the plurality of transfer lugs 130 to the power distribution interface 210 via the associated plurality of helical spring connectors 140 and during operation. It can be seen in FIG. 3 the distribution of mechanical and locking forces 310 between the plurality of transfer lugs 130, plurality of associated helical spring connectors 140 and the power distribution interface 210 (shown in FIG. 2). It can also be seen in FIGS. 2 and 3 that the power planes 330 (shown in FIG. 3) are configured to receive the DC power via each transfer lug 130, helical spring contact 410, helical spring barrel housing 420 and helical spring connector flange 430. Further it can be seen in FIG. 3 that the helical spring connectors 140 provide the needed complaint mechanical coupling between the plurality of transfer lugs 130 and the power distribution interface 210 upon securing the plurality of transfer lugs 130 to the power distribution interface 210 via the plurality of helical spring connectors 140. It some embodiments, as shown in FIG. 3, the power distribution interface 210 is configured with a plurality of recesses 220 to receive the heads of the plurality of transfer lugs 130 such that the heads of the plurality of transfer lugs 130 are flush with the top surface of the power distribution interface 210. In these embodiments, the helical spring connectors 140 are conductive and mechanically compliant.

As shown in FIG. 3, each of the plurality of transfer lugs 130 is disposed through the power distribution board 120 and an associated helical spring connector 140. Further as shown in FIG. 3, the helical spring connector flange 430 is affixed to the power distribution board 120 such that the helical spring connector flange 430 does not bear any substantial structural stress, while the flanged end of the plurality of transfer lugs 130 provides the needed mechanical clamping force. This compliant mechanical coupling/electrical connection enables proper functioning of the embedded fasteners, such as the plurality of transfer lugs 130 and the associated plurality of helical spring connectors 140. In these embodiments, the power distribution interface 210 including the power distribution board 120 and the plurality of transfer lugs 130 is topped by as interposer 110 and at least one PCB including at least one integrated circuit (not shown for simplicity). Also in these embodiments, the DC power to the integrated circuits is delivered via the poi planes disposed in the power distribution interface 210.

Figure 4:
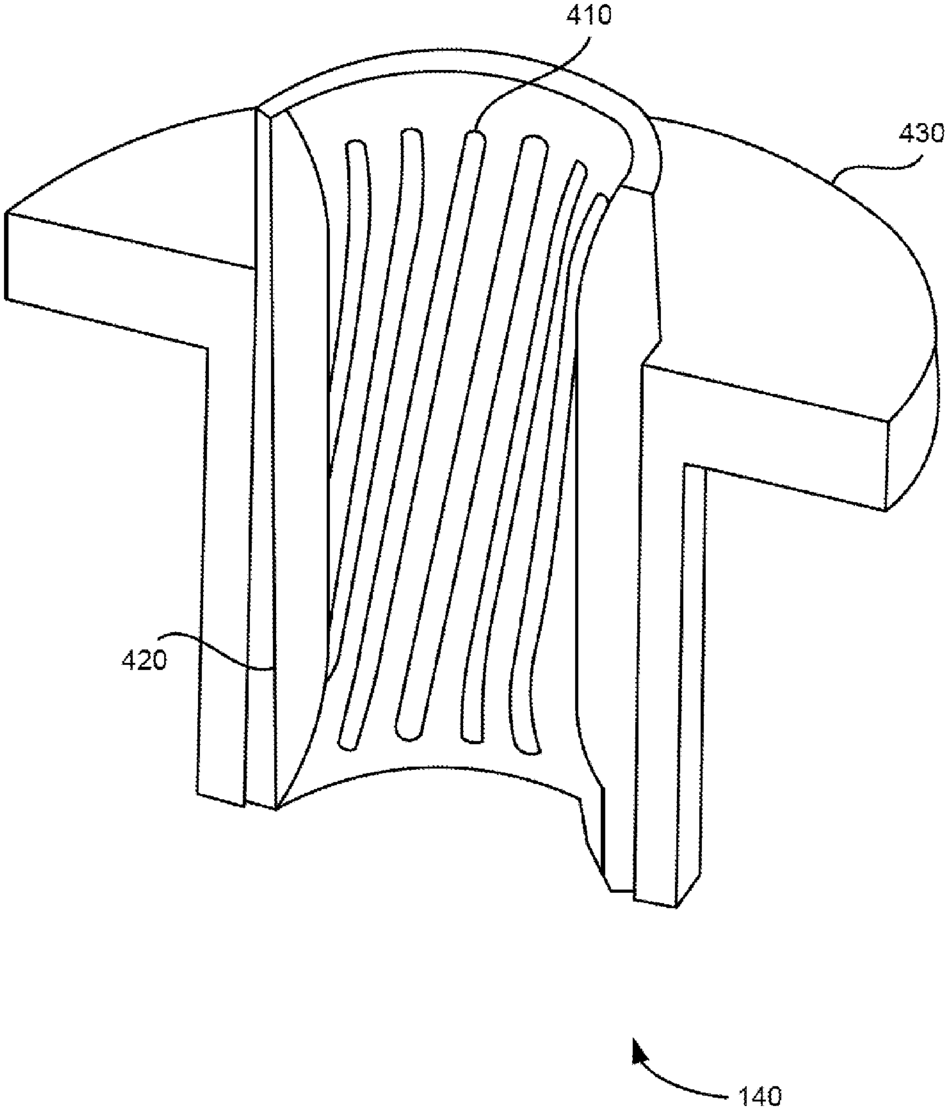
FIG. 4 is a cross-sectional view of a helical spring connector used in securing the transfer lugs to the power distribution interface, such as those shown in FIGS. 1 and 2, according to an example embodiment of the present subject matter.

FIG. 4 is a cross-sectional view of a helical spring connector 140 used in securing the plurality of transfer lugs 130 to the power distribution interface 210, such as those shown in FIGS. 1 and 2, according to an example embodiment of the present subject matter. It can be seen in FIG. 4 that the helical spring connector 140 includes a helical spring contact 410. Further as shown in FIG. 4, the helical spring connector 140 includes a helical spring barrel housing 420 that is configured to receive the helical spring contact 410 concentrically inside the helical spring barrel housing 420. Furthermore as shown in FIG. 4, the helical spring connector 140 includes a helical spring connector flange 430 that is configured to receive the helical spring barrel housing 420 along with the helical spring contact 410 concentrically inside the helical spring connector flange 430. Exemplary helical spring barrel housing 420 is copper barrel housing/copper sheath. In some embodiments, the helical spring connector flange 430 is affixed to the power distribution interface 210 using joining techniques, such as soldering, brazing, pressing, and the like. Further in some embodiments, the helical spring barrel housing 420 is affixed to the helical spring contact 410 via joining techniques, such as soldering, brazing, pressing, and so on. In these embodiments, the helical spring connector flange 430 is made of high conductivity metal flange.

In operation, the plurality of transfer lugs 130 after inserting via the power distribution board 120 it contacts associated plurality of helical spring contacts 410 within the helical spring connector 140. When a DC current is passed through the plurality of transfer lugs 130 it transfers the DC power to the helical spring contacts 410, then to the helical spring barrel housing 420 and the helical spring connector flange 430 and then to the distribution power planes 330 as shown in FIG. 3. In some embodiments, the helical spring barrel housing 420 is a copper sheath and in these embodiments, the copper sheath contacts the distribution power planes 330 via plated through hole disposed on the power distribution board 120. This configuration allows for a large DC current to be passed from the plurality of transfer lugs 130 to the helical spring connector 140 and then to the distribution power planes 330 disposed on the power distribution hoard 120.

Even though the above idea is described with reference to DC power, one skilled in the art can envision that the idea works, similarly, for AC power as well.

The foregoing descriptions of specific embodiments of the present disclosure have been presented for purposes of illustration and description. They are not intended to be exhaustive or to limit the present disclosure to the precise forms disclosed, and obviously many modifications and variations are possible, in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. An apparatus comprising:

a first printed circuit board (PCB);

a transfer lug having a flat head and a cylindrical body, wherein the surface of said flat head is wider than the radius of said cylindrical body, wherein said flat head is affixed to a first surface of said first PCB;

a second PCB having a lug hole with a T-shape cross-section configured to receive said transfer lug; and a compliant mechanical connector for securing said transfer lug to said second PCB, wherein said compliant mechanical connector is electrical conductive.

2. The apparatus of claim 1, wherein said transfer lug includes screw threads on an end opposite said flat head.

3. The apparatus of claim 1, wherein said compliant mechanical connector is configured to receive said transfer lug to provide mechanical compliance and to maximize power distribution from said transfer lug to said PCBs.

4. The apparatus of claim 1, wherein said compliant mechanical connector includes:

a helical spring contact;

a helical spring barrel housing configured to receive said helical spring contact concentrically within said helical spring barrel housing; and a helical spring connector flange configured to receive said helical spring barrel housing concentrically within said helical spring connector flange.

5. The apparatus of claim 1, wherein said first PCB includes a plurality of electrical devices on a second surface only.

6. The apparatus of claim 1, wherein said flat head of said transfer lug is flush with one surface of said second PCB, wherein said one surface of said second PCB is in direct contact with said another surface of said first PCB.

7. The apparatus of claim 1, wherein said compliant mechanical connector is affixed to said second PCB via solder.

8. The apparatus of claim 1, wherein said compliant mechanical connector is affixed to said second PCB via epoxy.

9. The apparatus of claim 1, wherein said first and second PCBs are configured to receive DC power via said transfer lug.

* * * * *